US010985137B2

(12) United States Patent
Chen et al.

(10) Patent No.: US 10,985,137 B2
(45) Date of Patent: Apr. 20, 2021

(54) STACKED INTEGRATED CIRCUIT STRUCTURE AND METHOD OF FORMING

(71) Applicant: Taiwan Semiconductor Manufacturing Company, Ltd., Hsinchu (TW)

(72) Inventors: Wei-Ming Chen, Taipei (TW); Hsien-Pin Hu, Zhubei (TW); Shang-Yun Hou, Jubei (TW); Wen Hsin Wei, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/230,539

(22) Filed: Dec. 21, 2018

(65) Prior Publication Data

US 2019/0115320 A1 Apr. 18, 2019

Related U.S. Application Data

(63) Continuation of application No. 14/928,844, filed on Oct. 30, 2015, now Pat. No. 10,163,856.

(51) Int. Cl.
*H01L 23/538* (2006.01)
*H01L 25/065* (2006.01)
(Continued)

(52) U.S. Cl.
CPC ........ *H01L 25/0655* (2013.01); *H01L 21/486* (2013.01); *H01L 21/4853* (2013.01); *H01L 21/4857* (2013.01); *H01L 21/565* (2013.01); *H01L 23/3142* (2013.01); *H01L 23/49811* (2013.01); *H01L 23/49827* (2013.01); *H01L 23/49838* (2013.01); *H01L 23/5383* (2013.01); *H01L 23/5389* (2013.01); *H01L 24/19* (2013.01); *H01L 24/20* (2013.01);
(Continued)

(58) Field of Classification Search
CPC .................................................. H01L 23/5389
USPC ......................................................... 257/776
See application file for complete search history.

(56) References Cited

U.S. PATENT DOCUMENTS 7,564,115 B2 7/2009 Chen et al.
7,633,165 B2 12/2009 Hsu et al.
(Continued)

FOREIGN PATENT DOCUMENTS

TW 201330200 A 7/2013
TW 201533882 A 9/2015

*Primary Examiner* — Hsin Yi Hsieh
(74) *Attorney, Agent, or Firm* — Slater Matsil, LLP

(57) ABSTRACT

A semiconductor device, and a method of forming the device, are provided. The semiconductor device includes a first die having a first plurality of contact pads and a second die having a second plurality of contact pads. A substrate is bonded to a first contact pad of the first plurality of contact pads and a first contact pad of the second plurality of contact pads in a face-to-face orientation with the first die and the second die. A first through via extends through the substrate. Molding material is interposed between the first die, the second die and the substrate, the molding material extending along sidewalls of the first die, the second die, and the substrate. A second through via is positioned over a second contact pad of the first plurality of contact pads, the second through via extending through the molding material.

20 Claims, 13 Drawing Sheets

304
200
200
200
300
300

(51) Int. Cl.

| | |
|---|---|
| ***H01L 23/00*** | (2006.01) |
| ***H01L 21/48*** | (2006.01) |
| ***H01L 21/56*** | (2006.01) |
| ***H01L 23/31*** | (2006.01) |
| ***H01L 23/498*** | (2006.01) |
| ***H01L 25/00*** | (2006.01) |

(52) U.S. Cl.

CPC .............. *H01L 24/96* (2013.01); *H01L 24/97* (2013.01); *H01L 25/50* (2013.01); *H01L 21/568* (2013.01); *H01L 23/49816* (2013.01); *H01L 24/03* (2013.01); *H01L 24/05* (2013.01); *H01L 24/11* (2013.01); *H01L 24/13* (2013.01); *H01L 24/16* (2013.01); *H01L 24/73* (2013.01); *H01L 24/81* (2013.01); *H01L 24/92* (2013.01); *H01L 2224/0345* (2013.01); *H01L 2224/03452* (2013.01); *H01L 2224/04105* (2013.01); *H01L 2224/05073* (2013.01); *H01L 2224/05166* (2013.01); *H01L 2224/05644* (2013.01); *H01L 2224/05647* (2013.01); *H01L 2224/05655* (2013.01); *H01L 2224/05666* (2013.01); *H01L 2224/11424* (2013.01); *H01L 2224/11464* (2013.01); *H01L 2224/12105* (2013.01); *H01L 2224/131* (2013.01); *H01L 2224/13109* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16146* (2013.01); *H01L 2224/16227* (2013.01); *H01L 2224/16235* (2013.01); *H01L 2224/73209* (2013.01); *H01L 2224/73259* (2013.01); *H01L 2224/81005* (2013.01); *H01L 2224/81815* (2013.01); *H01L 2224/92124* (2013.01); *H01L 2224/92224* (2013.01); *H01L 2224/97* (2013.01); *H01L 2924/18161* (2013.01); *H01L 2924/18162* (2013.01)

(56) References Cited

U.S. PATENT DOCUMENTS

| | | | |
|---|---|---|---|
| 7,825,024 | B2 | 11/2010 | Lin et al. |
| 7,973,413 | B2 | 7/2011 | Kuo et al. |
| 8,105,875 | B1 | 1/2012 | Hu et al. |
| 8,158,456 | B2 | 4/2012 | Chen et al. |
| 8,183,578 | B2 | 5/2012 | Wang |
| 8,183,579 | B2 | 5/2012 | Wang |
| 8,227,902 | B2 | 7/2012 | Kuo |
| 8,278,152 | B2 | 10/2012 | Liu et al. |
| 8,426,961 | B2 | 4/2013 | Shih et al. |
| 8,669,174 | B2 | 3/2014 | Wu et al. |
| 8,802,504 | B1 | 8/2014 | Hou et al. |
| 8,803,292 | B2 | 8/2014 | Chen et al. |
| 8,803,316 | B2 | 8/2014 | Lin et al. |
| 9,013,041 | B2 | 4/2015 | Karikalan et al. |
| 9,368,450 | B1 * | 6/2016 | Gu ...................... H01L 25/0655 |
| 2009/0244874 | A1 | 10/2009 | Mahajan et al. |
| 2010/0019368 | A1 | 1/2010 | Shin |
| 2012/0211885 | A1 | 8/2012 | Choi et al. |
| 2014/0001645 | A1 | 1/2014 | Lin et al. |
| 2014/0131854 | A1 | 5/2014 | Hawk et al. |
| 2014/0159228 | A1 | 6/2014 | Teh et al. |
| 2014/0175673 | A1 | 6/2014 | Kim et al. |
| 2014/0225258 | A1 | 8/2014 | Chiu et al. |
| 2014/0252572 | A1 | 9/2014 | Hou et al. |
| 2015/0070863 | A1 | 3/2015 | Yun et al. |
| 2016/0133571 | A1 | 5/2016 | Lee et al. |
| 2017/0011993 | A1 | 1/2017 | Zhao et al. |
| 2017/0110407 | A1 | 4/2017 | Chaware et al. |

* cited by examiner 1000
700
600
302
300
304
202
200
200
100

STACKED INTEGRATED CIRCUIT STRUCTURE AND METHOD OF FORMING

PRIORITY CLAIM AND CROSS-REFERENCE

This application is a continuation of U.S. patent application Ser. No. 14/928,844, entitled "Stacked Integrated Circuit Structure and Method of Forming," filed on Oct. 30, 2015, which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
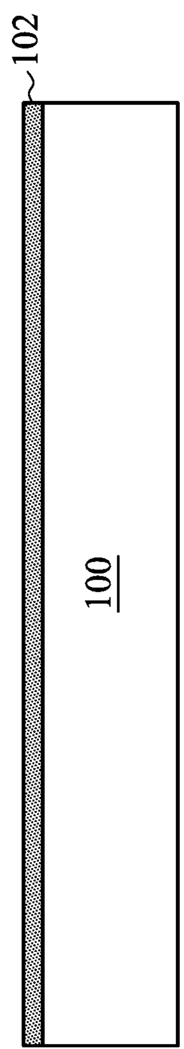
FIGS. 1 through 12 are cross-sectional views of intermediate stages in the manufacturing of a Through Via (TV) package in accordance with some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked integrated circuit package including through vias and methods of forming the same are provided in accordance with various exemplary embodiments. The intermediate stages of forming the package are illustrated and variations of embodiments are discussed.

FIGS. 1-12 illustrate cross-sectional views of intermediate steps in forming a semiconductor package in accordance with some embodiments. In some embodiments, semiconductor packages described herein may be formed with reduced cost and increased reliability. For example, in some exemplary embodiments, a substrate is in a face-to-face connection with two integrated circuit dies, and the substrate is positioned so that it overlies both integrated circuit dies at least in part. The orientation and position of the substrate and the integrated circuit dies allows for shorter connections between and amongst the substrate and the integrated circuit dies, which may increase reliability and electrical performance in some embodiments. Also, in some embodiments, the substrate may allow for fine pitch metal connections. As such, the substrate may enable connections in a smaller space and with less material used, which may lower manufacturing costs.

Referring first to FIG. 1, there is shown a carrier substrate 100 having a release layer 102 formed thereon. Generally, the carrier substrate 100 provides temporary mechanical and structural support during subsequent processing steps. The carrier substrate 100 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 100 is planar in order to accommodate further processing.

The release layer 102 is an optional layer formed over the carrier substrate 100 that may allow easier removal of the carrier substrate 100. As explained in greater detail below, various layers and devices will be placed over the carrier substrate 100, after which the carrier substrate 100 may be removed. The optional release layer 102 aids in the removal of the carrier substrate 100, reducing damage to the structures formed over the carrier substrate 100. The release layer 102 may be formed of a polymer-based material. In some embodiments, the release layer 102 is an epoxy-based thermal release material, which loses its adhesive property when heated, such as a Light-to-Heat-Conversion (LTHC) release coating. In other embodiments, the release layer 102 may be an ultra-violet (UV) glue, which loses its adhesive property when exposed to UV light. The release layer 102 may be dispensed as a liquid and cured. In other embodiments, the release layer 102 may be a laminate film laminated onto the carrier substrate 100. Other release layers may be utilized.

Figure 2:
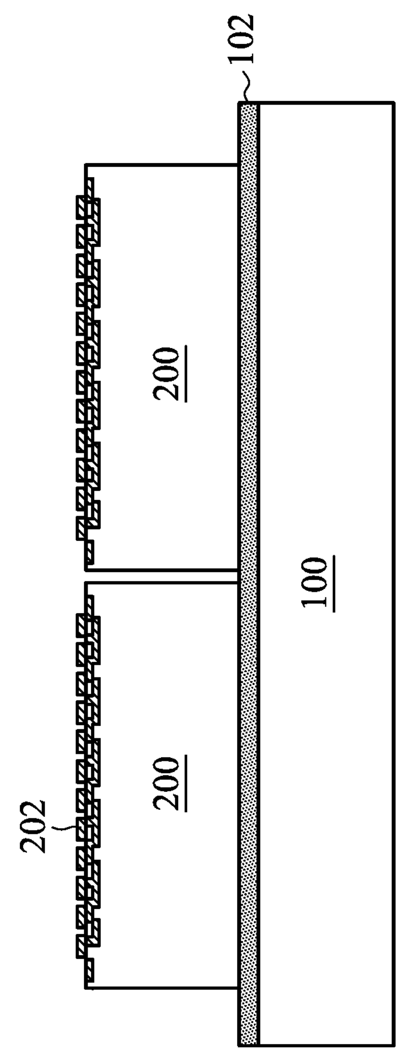

Referring to FIG. 2, two integrated circuit dies 200 are bonded to the backside of release layer 102 in accordance with some embodiments. In some embodiments, the integrated circuit dies 200 may be adhered to release layer 102 by an adhesive layer (not shown), such as a die-attach film (DAF). A thickness of the adhesive layer may be in a range from about 5 μm to about 50 μm, such as about 10 um. The integrated circuit dies 200 may be two dies 200 as illustrated in FIG. 2, or in some embodiments, a single die or more than two dies may be attached. Integrated circuit dies 200 may include any die suitable for a particular design. For example, the integrated circuit dies may include a static random access memory (SRAM) chip or a dynamic random access memory (DRAM) chip, a processor, a memory chip, logic chip, analog chip, digital chip, a central processing unit (CPU), a graphics processing unit (GPU), or a combination thereof, or the like. The integrated circuit dies 200 may be attached to a suitable location on release layer 102 for a particular design or application. Before being attached to the release layer 102, the integrated circuit dies 200 may be processed according to applicable manufacturing processes to form integrated circuits (not shown) in the integrated circuit dies 200. The integrated circuit dies comprise contacts 202 on a surface of the integrated circuit dies 200 that faces away from carrier substrate 100. Contacts 202 allow the integrated circuit dies 200 to connect to each other and/or to other external devices, components, or the like. As will be described in detail below, through vias (TVs) will be formed overlying certain contacts 202, and a substrate will be bonded to certain other contacts 202. The placement of contacts 202 on a top surface of integrated circuit dies 200 may be designed in a manner that they are positioned underneath a planned position of TVs or a planned position of the substrate.

Figure 3:
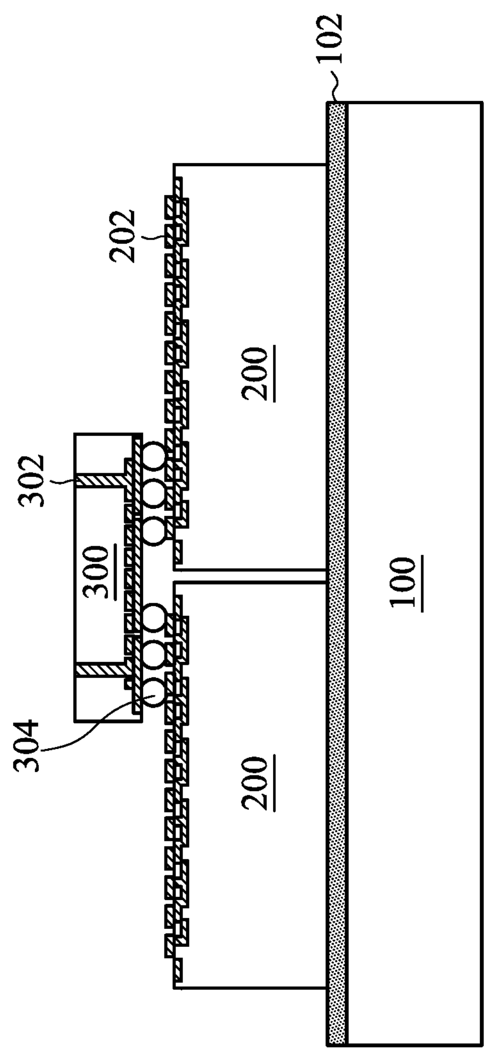

Referring to FIG. 3, a substrate 300 is placed over integrated circuit dies 200 so that it is in a face-to-face connection with integrated circuit dies 200, and positioned so that it overlaps each integrated circuit die at least in part. Substrate 300 may allow for electrical connection between and amongst integrated circuits 200, devices internal to substrate 300 (if any), and devices and components, or the like, external to the package. Depending on the particular design an application of the structure, substrate 300 may contain one or more layers of metal connections, one or more active devices, one or more integrated circuit dies, one or more passive devices, a combination of these, or the like. Substrate 300 may also contain one or more through vias (TVs) 302, which may allow for external electrical connection to substrate 300, as well as to contacts 202 through metal connections in substrate 300.

In some embodiments, substrate 300 may eliminate the need for one or more redistribution layers, which generally provide a conductive pattern that is different than the pattern of existing integrated circuit dies, through vias, or the like. For example, substrate 300 may provide metal connections that would otherwise be provided in one or more redistribution layers. In some embodiments, substrate 300 provides these connections with a finer pitch which consume less space in the package and which may lower manufacturing costs. For example, in some embodiments, substrate 300 may include metal connections with a pitch of about 0.1 μm to about 20 μm, such as about 0.4 μm.

Substrate 300 is positioned so that it is in a face-to-face connection with integrated circuit dies 200. In some embodiments, substrate 300 is also positioned so that it overlies two adjacent integrated circuit dies 200 in part. Such a configuration allows for a shorter distance between metal connections between and amongst substrate 300 and integrated circuit dies 200. The shorter distances may help to increase reliability of the metal connections.

Substrate 300 may be pre-formed using known methods. For example, a substrate 300 of a suitable material may be provided. The substrate 300 may comprise one or more active devices, depending on the particular design. An interlayer dielectric (ILD) may be formed over the substrate 300 and the active devices (if present) by chemical vapor deposition, sputtering, or any other method suitable for forming an ILD. The TVs 302 may be formed by applying and developing a suitable photoresist layer, and then etching the ILD and the underlying substrate 300 to form openings in the substrate 300. The openings at this stage are formed so as to extend into the substrate 300 at least further than the active devices in the ILD, and to a depth at least greater than the eventual desired height of the finished substrate 300. The openings may be formed to have a diameter of between about 5 μm and about 20 μm, such as about 12 μm.

Once the openings have been formed, the openings may be filled with a barrier layer and a conductive material to form the TVs 302. The barrier layer may comprise a conductive material such as titanium nitride, although other materials, such as tantalum nitride, titanium, a dielectric, or the like may alternatively be utilized. The barrier layer may be formed using a chemical vapor deposition (CVD) process, such as plasma-enhanced chemical vapor deposition (PECVD). However, other alternative processes, such as sputtering or metal organic chemical vapor deposition (MOCVD), may alternatively be used. The barrier layer is formed so as to contour to the underlying shape of the openings for the TVs 302.

The conductive material may comprise copper, although other suitable materials such as aluminum, alloys, doped polysilicon, combinations thereof, and the like, may alternatively be utilized. The conductive material may be formed by depositing a seed layer and then electroplating copper onto the seed layer, filling and overfilling the openings for the TVs 302. Once the openings for the TVs 302 have been filled, excess barrier layer and excess conductive material outside of the openings for the TVs 302 are removed through a grinding process such as chemical mechanical polishing (CMP), although any suitable removal process may be used. Finally, the backside of substrate 300 is thinned to expose TVs 302. The thinning may be performed with a grinding process such as a CMP, although other suitable processes, such as etching, may alternatively be used.

After the thinning of the substrate 300, a cleaning etch may be performed. This cleaning etch is intended to clean and polish the substrate 300 after the CMP. Additionally, this cleaning etch also helps release stresses that may have formed during the CMP process of grinding the substrate 300. The cleaning etch may use $HNO_3$, although other suitable etchants may alternatively be used.

The methods described herein for forming substrate 300 are meant as examples only. Any suitable methods of forming substrate 300 may be used, including the same or different methods, or the like.

Substrate 300 may comprise any material that is suitable for a particular design. The substrate 300 generally comprises a material similar to the material used to form integrated circuit dies 200, such as silicon. While the substrate 300 may be formed of other materials, it is believed that using silicon substrates may reduce stress because the coefficient of thermal expansion (CTE) mismatch between the silicon substrates and the silicon typically used for the integrated circuit dies 200 is lower than with substrates formed of different materials.

In some embodiments, the size of the substrate 300 is smaller than the size of integrated circuit dies 200. For example, in some embodiments, substrate 300 may have a height of about 10 μm to about 100 μm, such as about 50 μm.

Substrate 300 is bonded to contacts 202 on integrated circuits 200 using connectors 304. The connectors 304 may be micro bumps, solder balls, metal pillars, controlled collapse chip connection (C4) bumps, electroless nickel-electroless palladium-immersion gold technique (ENEPIG) formed bumps, combination thereof (e.g., a metal pillar having a solder ball attached thereof), or the like. The connectors 304 may include a conductive material such as solder, copper, aluminum, gold, nickel, silver, palladium, tin, the like, or a combination thereof. In some embodiments, the connectors 304 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 304 may form a grid, such as a ball grid array (BGA). In some embodiments, a reflow process may be performed, giving the connectors 304 a shape of a partial sphere in some embodiments. Alternatively, the connectors 304 may comprise other shapes. The connectors 304 may also comprise non-spherical conductive connectors, for example.

Figure 4:
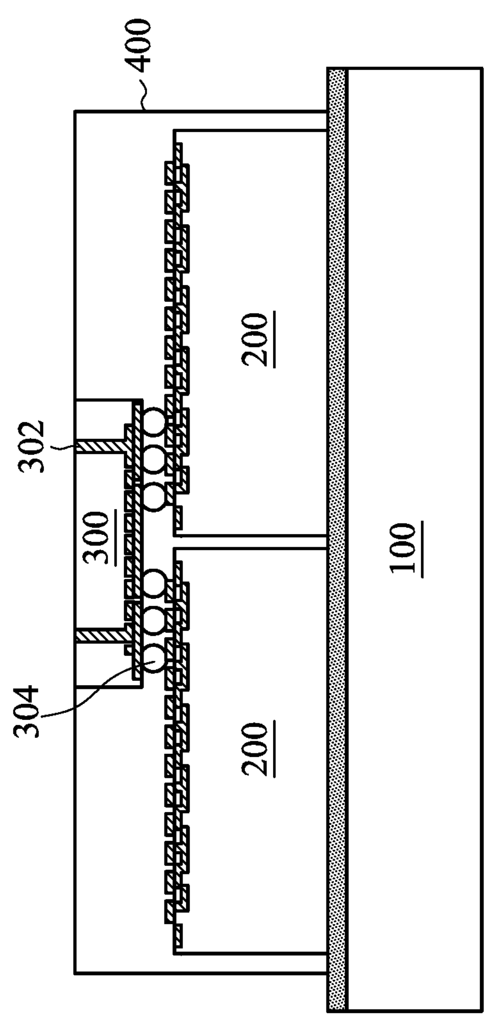

Next, referring to FIG. 4, a molding material 400 is formed along sidewalls of integrated circuit dies 200 and substrate 300. Molding material 400 fills the space between integrated circuit dies 200, substrate 300, and connectors 304, in accordance with some embodiments. Molding material 400 supports integrated circuit dies 200 and substrate 300 and reduces cracking of connectors 304. Molding material 400 may include a molding underfill, a molding compound, an epoxy, or a resin.

Next, a grinding step is performed to thin molding material 400, until TVs 302 are exposed. The resulting structure is shown in FIG. 4. Due to the grinding, the top ends of TVs 302 are substantially level (coplanar) with the top surface of molding material 400. As a result of the grinding, residues such as metal particles may be generated, and left on the top surfaces. Accordingly, after the grinding, a cleaning may be performed, for example, through a wet etching, so that the residue is removed.

Figure 5:
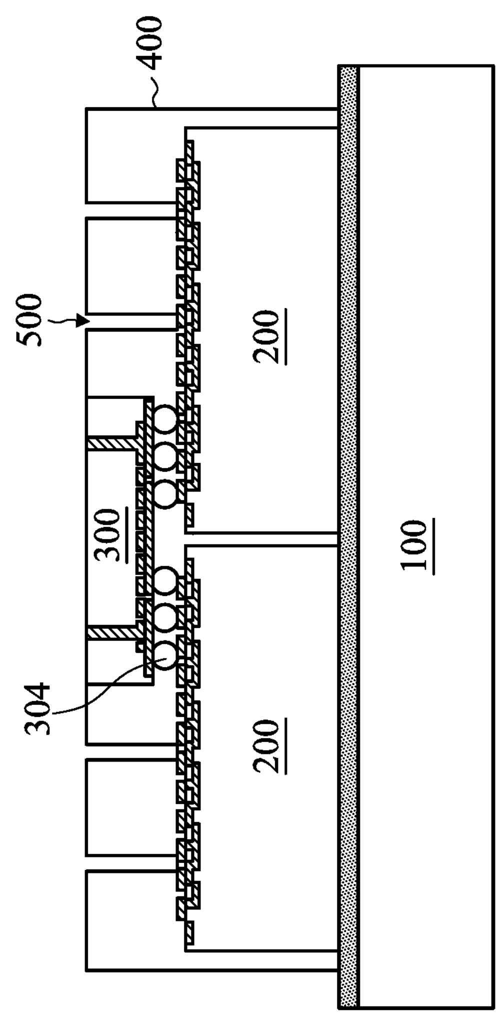

Referring to FIG. 5, a plurality of openings 500 are created in molding material 400. As will be discussed in greater detail below, TVs will be formed in the openings 500 to enable external electrical connections to contacts 202 on integrated circuit dies 200. The openings 500 may be formed by any suitable method, such as laser drilling, etching, or the like. A diameter of the openings 500 are dependent upon the desired diameter of the planned TVs that will be formed in the openings 500. In some embodiments, the diameter of the openings 500 may be about 50 μm to about 300 μm, such as about 100 μm. As can be seen from FIG. 5, the height of openings 500 is determined by the height of substrate 300. In some embodiments, the height of the openings 500 may be about 50 μm to about 300 μm, such as about 100 μm.

Figure 6:
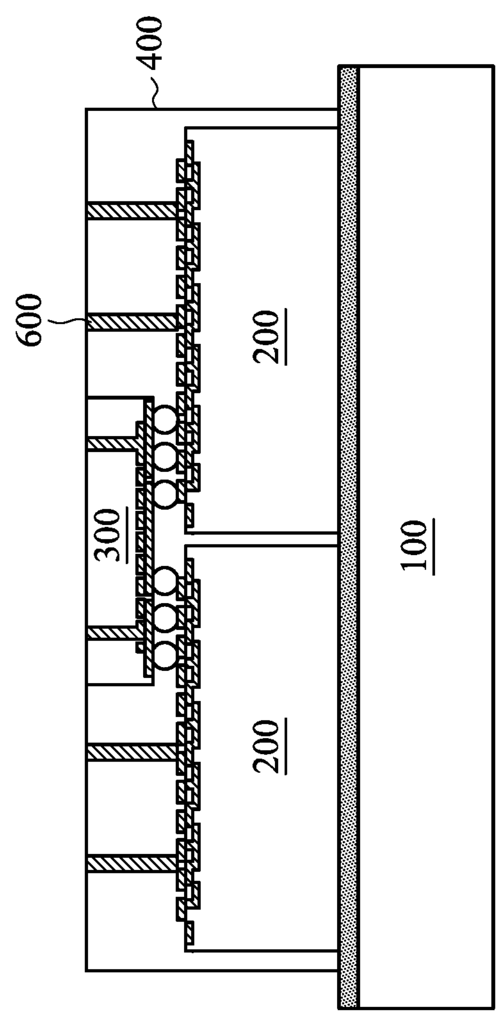

Referring to FIG. 6, TVs 600 are formed in the openings 500. The TVs 600 may be formed, for example, by forming a conductive seed layer over the molding material 400. In some embodiments, the seed layer is a metal layer, which may be a single layer or a composite layer comprising a plurality of sub-layers formed of different materials. The seed layer may be made of copper, titanium, nickel, gold, or a combination thereof, or the like. In some embodiments, the seed layer comprises a titanium layer and a copper layer over the titanium layer. The seed layer may be formed using, for example, physical vapor deposition (PVD), CVD, atomic layer deposition (ALD), a combination thereof, or the like.

Next, openings 500 may be filled with a conductive material using, for example, an electroless plating process or an electrochemical plating process, thereby creating TVs 600. Metal features TVs 600 may comprise copper, aluminum, tungsten, nickel, solder, or alloys thereof. The top-view shapes of TVs 600 may be rectangles, squares, circles, or the like. Next, an etch step or a grinding step may be performed to remove the exposed portions of the seed layer overlying the molding material 400 and any excess conductive material overlying openings 500. Any suitable etching or grinding process may be used. The resulting structure is depicted in FIG. 6.

In some embodiments, when the seed layer is formed of a material similar to or the same as the TVs 600, the seed layer may be merged with the TVs 600 with no distinguishable interface between. In some embodiments, there exist distinguishable interfaces between the seed layer and the TVs 600.

Figure 7:
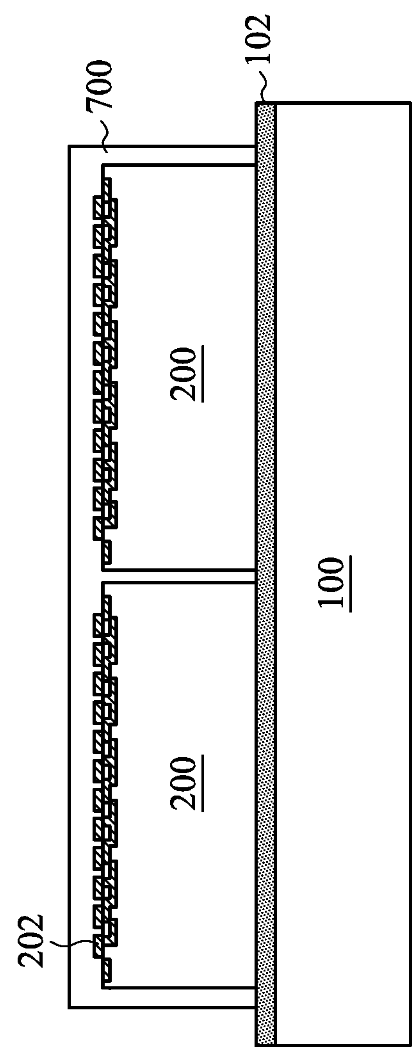

Alternatively, in some embodiments TVs 600 may be formed before molding material is formed along the sidewalls of substrate 300. For example, before substrate 300 is bonded to integrated circuit dies 200, a first molding material 700 may be formed along sidewalls of the integrated circuit dies 200, as depicted in FIG. 7. The first molding material 700 fills the gaps between integrated circuit dies 200, and may be in contact with release layer 102. The first molding material 700 may include a molding compound, a molding underfill, an epoxy, or a resin. The top surface of the first molding material 700 is higher than the top ends of metal contacts 202.

Figure 8:
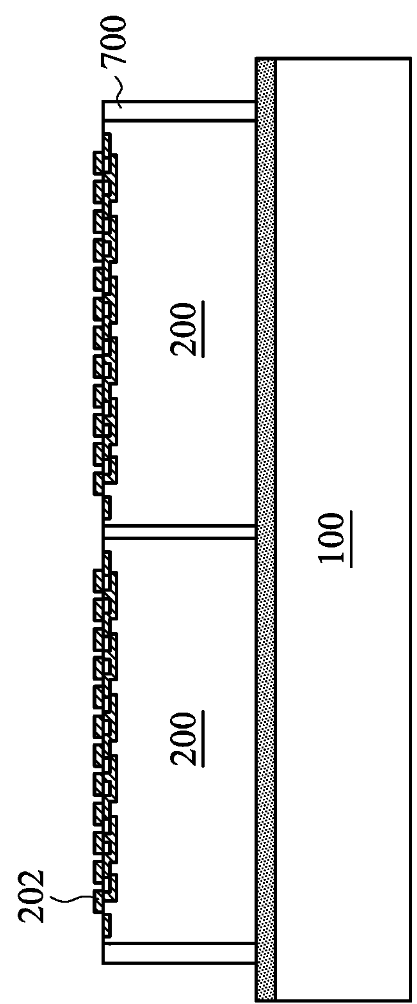

Next, a grinding step is performed to thin the first molding material 700, until metal contacts 202 are exposed. The resulting structure is shown in FIG. 8. Due to the grinding, the top ends of metal contacts 202 are substantially level (coplanar) with the top surface of the first molding material 700. As a result of the grinding, metal residues such as metal particles may be generated, and left on the top surfaces. Accordingly, after the grinding, a cleaning may be performed, for example, through a wet etching, so that the metal residue is removed.

Figure 9:
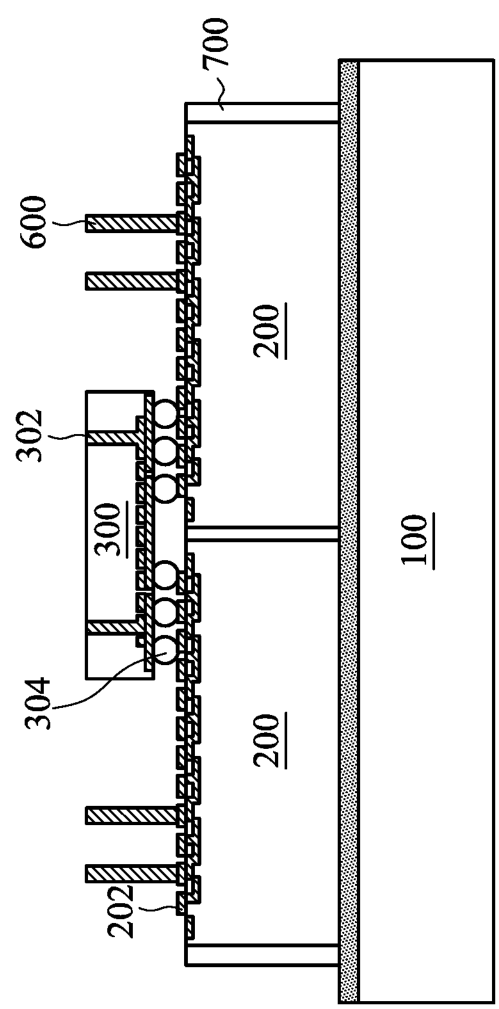
Figure 10:
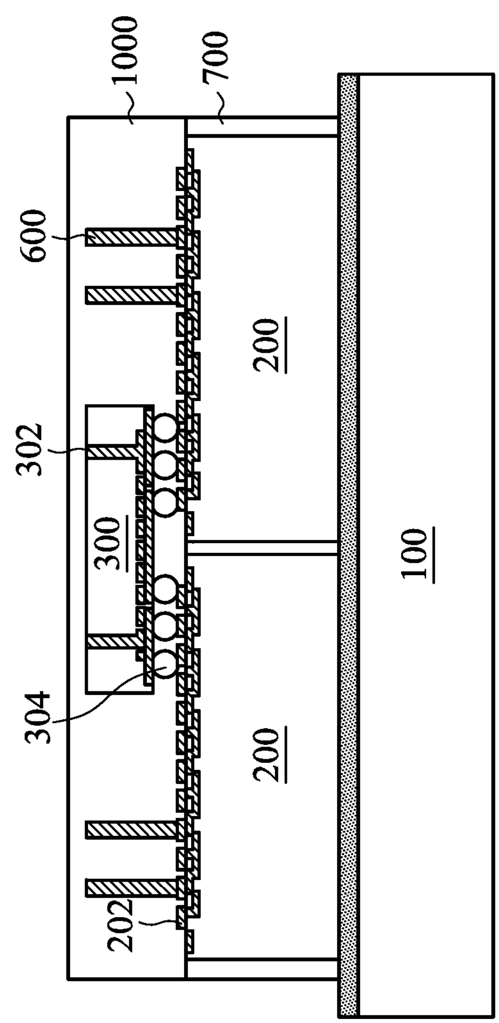

Referring to FIG. 9, TVs 600 are formed over metal contacts 202. In some embodiments a mask layer, such as a patterned photoresist layer, may be deposited and patterned, wherein openings in the mask layer expose the desired locations of TVs 600. The openings may be filled with a conductive material using, for example, an electroless plating process or an electrochemical plating process, thereby creating the TVs 600. The plating process may uni-directionally fill openings (e.g., from metal contacts 202 upwards) in the patterned photoresist layer. Uni-directional filling may allow for more uniform filling of such openings. Alternatively, a seed layer may be formed on sidewalls of the openings in the patterned photoresist layer, and such openings may be filled multi-directionally. TVs 600 may comprise copper, aluminum, tungsten, nickel, solder, or alloys thereof. The top-view of TVs 600 may be rectangles, squares, circles, or the like. Once the openings for the TVs 600 have been filled, excess seed layer (if any) and excess conductive material outside of the openings for the TVs 600 are removed through a grinding process such as chemical mechanical polishing (CMP), although any suitable removal process may be used. Finally, the photoresist layer may be removed by an acceptable ashing or stripping process, such as using an oxygen plasma or the like.

Alternatively, TVs 600 may also be realized with metal wire studs placed by a wire bonding process, such as a copper wire bonding process. The use of a wire bonding process may eliminate the need for depositing and patterning a mask layer, and plating to form the TVs 600.

Referring to FIG. 9, substrate 300 is bonded to metal contacts 202 using connectors 304, using the same or similar methods to those described above. Next, referring to FIG. 10, a second molding material 1000 is formed along sidewalls of substrate 300 and TVs 600. The second molding material 1000 fills the gaps between TVs 600 and substrate 300, and may be in contact with the first molding material 700 or metal contacts 202. The second molding material 1000 may include a molding compound, a molding underfill, an epoxy, or a resin. The top surface of the second molding material 1000 is higher than the top ends of TVs 600 and TVs 302.

Figure 11:
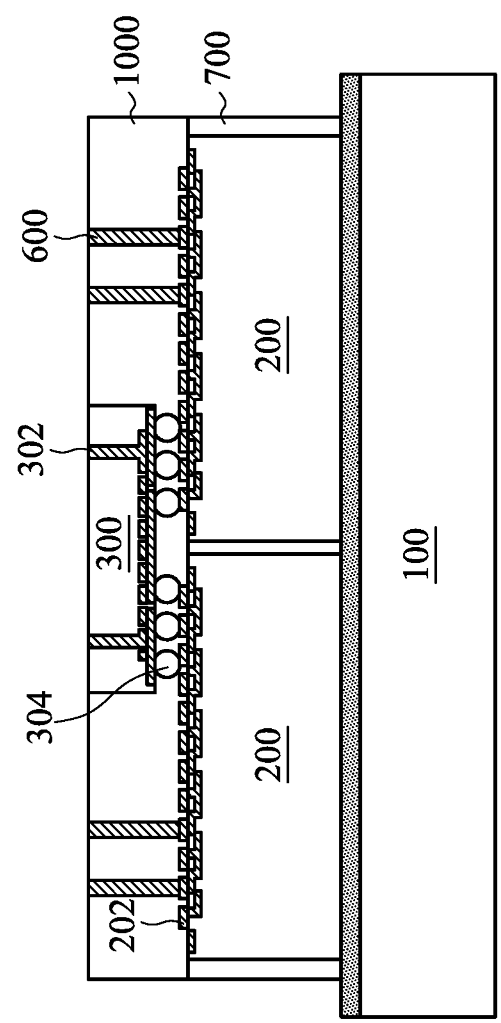

Next, a grinding step is performed to thin the second molding material 1000, until metal contacts 202 are exposed. The resulting structure is shown in FIG. 11. Due to the grinding, the top ends of TVs 600 and TVs 302 are substantially level (coplanar) with the top surface of the second molding material 1000. As a result of the grinding, metal residues such as metal particles may be generated, and left on the top surfaces. Accordingly, after the grinding, a cleaning may be performed, for example, through a wet etching, so that the metal residue is removed.

Figure 12:
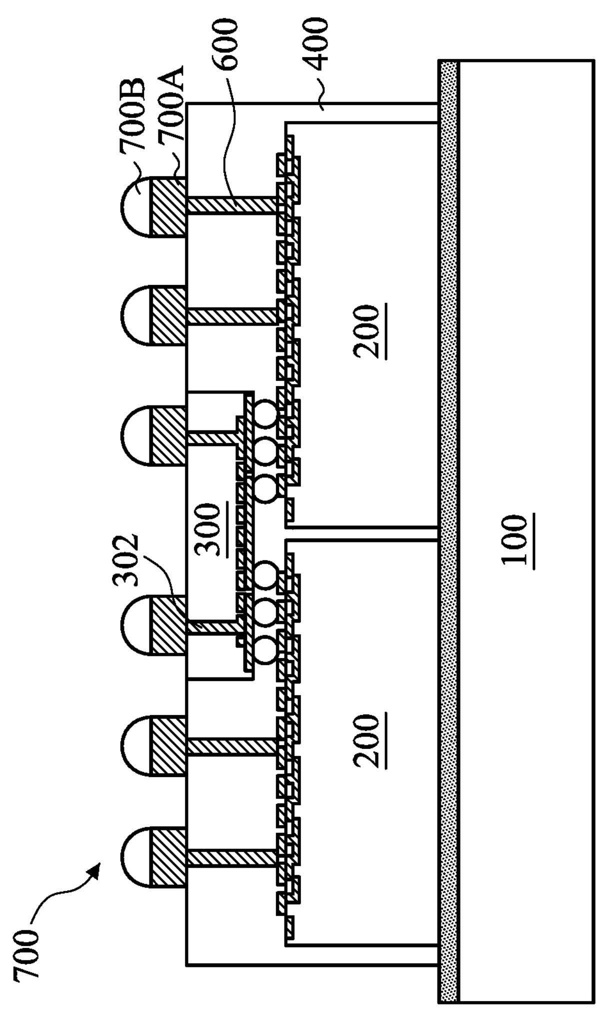

Next, referring to FIG. 12, connectors 700 are formed over TVs 600 and TVs 302. In some embodiments, connectors 700 each comprise a first conductive pillar 700A and a solder ball 700B formed on the first conductive pillar 700A.

Connectors 700 may be formed using any suitable method. For example, a seed layer (not shown) may be deposited over the second molding material 700 using methods similar to those described above. In some embodiments, the seed layer is a metal layer, which may be a single layer or a composite layer comprising a plurality of sublayers formed of different materials. The seed layer may be made of copper, titanium, nickel, gold, or a combination thereof, or the like. In some embodiments, the seed layer comprises a titanium layer and a copper layer over the titanium layer. The seed layer may be formed using, for example, physical vapor deposition (PVD), CVD, atomic layer deposition (ALD), a combination thereof, or the like.

Next, a photoresist layer may be deposited over molding material 400 and patterned to expose TVs 600 and TVs 302. The photo resist layer may be formed by spin coating or the like, and may be exposed to light for patterning using acceptable lithography processes. Next, the conductive pillars 700A may be formed by forming a conductive material in the openings of the photoresist layer and on the seed layer. The conductive material may be formed by plating, such as electroplating or electroless plating, or the like. The conductive material may comprise a metal, like copper, titanium, tungsten, aluminum, or the like, which may have a higher reflow temperature than, e.g., solder. A width of the first conductive pillars 700A corresponds to the width of the openings in the photoresist layer and may be in a range from about 20 μm to about 200 μm, such as about 100 μm. A height of the conductive pillars 700A may be in a range from about 20 μm to about 150 μm, such as about 40 μm, where the height is measured perpendicular to the top side of the molding material 400.

The solder cap 700B may be formed on the conductive pillars 700A and in the openings of the photoresist layer using plating such as electroplating or electroless plating, screen printing, or the like. The solder cap 700B can be any acceptable low-temperature reflowable conductive material, such as a lead-free solder. A width of the solder cap 700B corresponds to the width of the openings in the photoresist layer and the conductive pillars 700A and may be in a range from about 20 μm to about 200 μm, such as about 100 μm. A thickness of the solder cap 700B may in a range from about 5 μm to about 50 μm, such as about 20 μm, where the thickness is perpendicular to the top side of the molding material 400. A height of the connectors 700 (e.g., a conductive pillar 700A and a solder cap 700B) is in a range from about 25 μm to about 200 μm, such as about 60 μm. After forming the solder cap 700B, the photoresist layer may be removed by an acceptable ashing or stripping process, such as using an oxygen plasma or the like.

Figure 13:
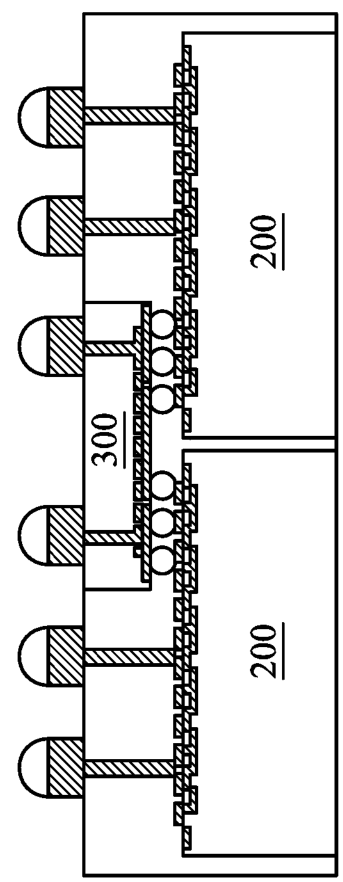
FIG. 13 is a cross section of a TV package in accordance with some exemplary embodiments.

Next, after the processing is complete, the carrier substrate 100 is removed. The release layer 102 is also removed. If more than one package has been created, the wafer is singulated into individual packages. The resulting structure is shown in FIG. 13.

Figure 14:
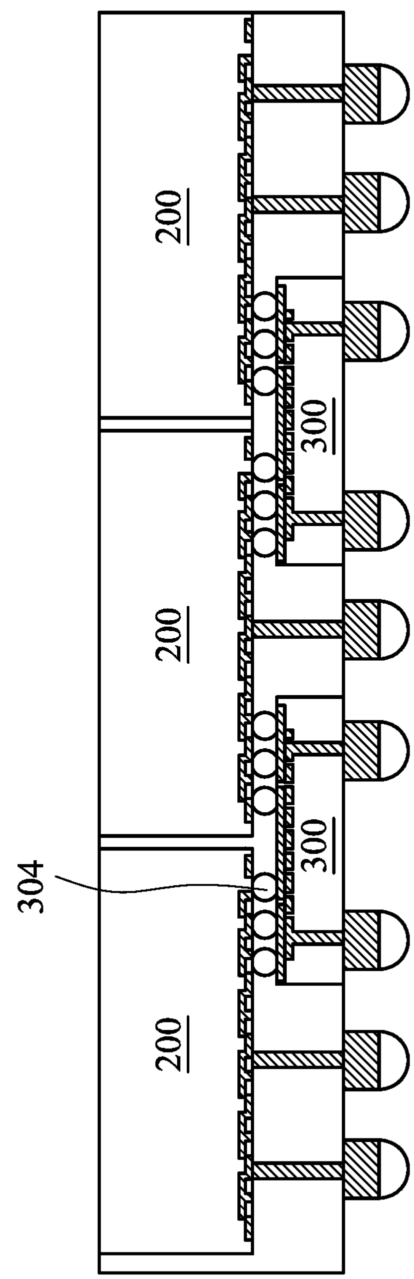
FIG. 14. is a cross section of a TV package in accordance with some exemplary embodiments.

Other embodiments are possible. For example, FIG. 14 illustrates a package containing three integrated circuit dies 200 and two substrates 300. Substrates 300 and integrated circuit dies 200 are in a face-to-face orientation and connected through connectors 304. Each substrate 300 is positioned to that it partially overlaps two integrated circuit dies 200. Connectors 700 provide external electrical connection to the package. The embodiment depicted in FIG. 14 can be formed using the same or similar methods as described herein.

In some embodiments, semiconductor packages described herein may be formed with reduced cost and increased reliability. For example, in some exemplary embodiments, a substrate is in a face-to-face connection with two integrated circuit dies, and the substrate is positioned so that it overlies both integrated circuit dies at least in part. The orientation and position of the substrate and the integrated circuit dies allows for shorter connections between and amongst the substrate and the integrated circuit dies, which may increase reliability in some embodiments. Also, in some embodiments, the substrate may allow for fine pitch metal connections. As such, the substrate may enable electrical connections in a smaller space and with less material used, which may lower manufacturing costs.

In some embodiments, a method of manufacturing a semiconductor device is provided. The method includes positioning a first die and a second die on a carrier substrate. A substrate is bonded to the first die and the second die so that the substrate is connected in a face-to-face connection with the first die and the second die. A molding material is formed along sidewalls of the first die, the second die, and the substrate. A first through via is formed over the first die so that the first through via extends through the molding material to the first die.

In some embodiments, a semiconductor device is provided. The semiconductor device includes a first die having a first plurality of contact pads and a second die having a second plurality of contact pads. A substrate is bonded to a first contact pad of the first plurality of contact pads and a first contact pad of the second plurality of contact pads in a face-to-face orientation with the first die and the second die. A first through via extends through the substrate. Molding material is interposed between the first die, the second die and the substrate, the molding material extending along sidewalls of the first die, the second die, and the substrate. A second through via is positioned over a second contact pad of the first plurality of contact pads, the second through via extending through the molding material.

In some embodiments, a semiconductor device is provided. The semiconductor device includes a first die and a second die beside the first die. An interposer is connected to the first die and the second die, the interposer oriented in a manner that contact pads on the interposer are on a surface of the interposer that faces toward the first die and the second die. The interposer is positioned so that it partially overlaps each of the first die and the second die. Molding material is interposed between the first die, the second die and the interposer, the molding material extending along sidewalls of the first die, the second die, and the interposer. A first through via is positioned over a contact pad of the first die, the first through via extending between the contact pad of the first die and an external connector disposed over the molding material.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device comprising:

a first die having a first plurality of contact pads;

a second die having a second plurality of contact pads;

a substrate bonded to a first contact pad of the first plurality of contact pads and to a second contact pad of the second plurality of contact pads, the substrate comprising a first through via extending from a front-side surface of the substrate to a back-side surface of the substrate, the front-side surface of the substrate facing the first plurality of contact pads and the second plurality of contact pads;

molding material disposed over the first die and the second die, the molding material being interposed between the first die, the second die, and the substrate, the molding material extending along sidewalls of the first die, the second die, and the substrate;

a second through via positioned over a third contact pad of the first plurality of contact pads, the second through via extending through the molding material, wherein surfaces of the second through via, the first through via, and the molding material are planar with the back-side surface of the substrate, wherein the second through via comprises a seed layer and a conductive material, the conductive material disposed on the seed layer, the seed layer contacting sidewalls of the molding material;

a first pillar connector disposed over the substrate and connected to the first through via; and a second pillar connector disposed over the molding material and connected to the second through via, the first pillar connector and the second pillar connector each comprising a same first conductive material.

2. The semiconductor device of claim 1 further comprising a third through via positioned over a fourth contact pad of the second plurality of contact pads, the third through via extending through the molding material, a surface of the third through via being planar with the back-side surface of the substrate.

3. The semiconductor device of claim 1 further comprising:

a first solder cap over the first pillar connector; and a second solder cap over the second pillar connector.

4. The semiconductor device of claim 1, wherein the substrate comprises metal connections with a pitch of about 0.1 μm to about 20 μm.

5. The semiconductor device of claim 1, wherein the substrate is positioned overlying each of the first die and the second die in part.

6. The semiconductor device of claim 5, wherein a center point of the substrate overlies an area between the first die and the second die.

7. A semiconductor device comprising:

a first die;

a second die beside the first die;

a first interposer connected to the first die and the second die, the first interposer comprising first contact pads disposed on a front-side surface of the first interposer that faces toward the first die and the second die, the first interposer at least partially overlapping each of the first die and the second die, the first interposer comprising an interposer through via extending from the front-side surface of the first interposer to a back-side surface of the first interposer;

molding material interposed between the first die, the second die, and the first interposer, the molding material extending along sidewalls of the first die, the second die, and the first interposer;

a first through via positioned over a contact pad of the first die, wherein the first through via comprises a seed layer and a conductive material, the conductive material disposed on the seed layer, the seed layer contacting sidewalls of the molding material;

a first external connector disposed over the first through via, the first through via extending between the first external connector and the contact pad of the first die; and a second external connector disposed over the interposer through via, the second external connector being physically and electrically connected to the interposer through via, the first external connector and the second external connector having the same height, wherein surfaces of the seed layer, the conductive material, the interposer through via, and the molding material are planar with the back-side surface of the first interposer.

8. The semiconductor device of claim 7, wherein the first interposer comprises metal connections with a pitch of about 0.1 μm to about 20 μM.

9. The semiconductor device of claim 7 further comprising:

a third die beside the first die;

a second interposer connected to the third die and the first die, the second interposer comprising second contact pads disposed on a front-side surface of the second interposer that faces toward the first die and the third die, the second interposer at least partially overlapping each of the first die and the third die;

a second through via positioned over a contact pad of the third die; and a second external connector on the second through via, the second through via extending through the molding material from the second external connector to the contact pad of the third die.

10. The semiconductor device of claim 7, wherein the first external connector comprises:

a first copper pillar on the first through via; and a first solder portion on the first copper pillar.

11. The semiconductor device of claim 7, wherein the first interposer is bonded to the first die and the second die with micro bump connectors.

12. A semiconductor device comprising:

a plurality of dies;

a plurality of substrates bonded to the dies, each of the substrates overlapping at least two of the dies, each substrate of the plurality of substrates comprising a first through via extending from a front-side surface of the substrate to a back-side surface of the substrate;

molding material interposed between the dies and the substrates, the molding material extending along sidewalls of each of the dies and along sidewalls of each of the substrates;

a plurality of second through vias extending through the molding material, each of the second through vias being electrically and physically connected to one of the dies, wherein each of the second through vias comprises a seed layer and a conductive material, the conductive material disposed on the seed layer, the seed layer contacting sidewalls of the molding material, wherein surfaces of the seed layer and the conductive material of each of the second through vias are planar with the back-side surface of each substrate of the plurality of substrates and with a surface of the first through via of the substrate;

a plurality of first copper pillars disposed over the substrates, the plurality of first copper pillars being connected to corresponding ones of the first through via of each substrate of the plurality of substrates; and a plurality of second copper pillars disposed over the molding material, the plurality of second copper pillars being connected to corresponding ones of the second through vias.

13. The semiconductor device of claim 12 further comprising:

a plurality of first solder caps over the first copper pillars; and a plurality of second solder caps over the second copper pillars.

14. The semiconductor device of claim 12, wherein the dies are integrated circuit dies and the substrates are interposers.

15. The semiconductor device of claim 12, wherein a center point of each substrate of the plurality of substrates overlies an area between the at least two of the dies that the substrate overlaps.

16. The semiconductor device of claim 12 further comprising:

a plurality of solder connectors electrically and physically connecting the dies to the substrates, the molding material surrounding each of the solder connectors.

17. The semiconductor device of claim 12, wherein each of the substrates comprise metal connections with a pitch of about 0.1 μm to about 20 μm.

18. The semiconductor device of claim 1 further comprising:

a first conductive connector bonding the substrate to the first contact pad; and a second conductive connector bonding the substrate to the second contact pad, the first conductive connector and the second conductive connector each comprising a same second conductive material.

19. The semiconductor device of claim 18, wherein the first conductive material is copper and the second conductive material is solder.

20. The semiconductor device of claim 7 further comprising:

a conductive connector disposed between the first interposer and the first die, the molding material extending around the conductive connector.

* * * * *

UNITED STATES PATENT AND TRADEMARK OFFICE

CERTIFICATE OF CORRECTION

PATENT NO. : 10,985,137 B2
APPLICATION NO. : 16/230539
DATED : April 20, 2021
INVENTOR(S) : Chen et al.

It is certified that error appears in the above-identified patent and that said Letters Patent is hereby corrected as shown below:

In the Claims

In Column 11, Line 9, Claim 8, delete "20 μM" and insert --20 μm--.

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*